United States Patent [19]

Gervay

[11] Patent Number: 5,073,462
[45] Date of Patent: Dec. 17, 1991

[54] PHOTOPOLYMERIZABLE COMPOSITION HAVING SUPERIOR ADHESION, ARTICLES AND PROCESSES

[75] Inventor: Joseph E. Gervay, Wilmington, Del.

[73] Assignee: E. I. Du Pont de Nemours and Company, Wilmington, Del.

[21] Appl. No.: 509,415

[22] Filed: Apr. 9, 1990

Related U.S. Application Data

[60] Division of Ser. No. 262,267, Oct. 20, 1988, Pat. No. 4,937,172, which is a continuation of Ser. No. 936,880, Dec. 2, 1986, abandoned.

[51] Int. Cl.$^5$ ............ G03F 7/033; G03F 7/09; B32B 3/00; B32B 15/08
[52] U.S. Cl. .................... 430/14; 430/270; 430/17; 430/18; 430/280; 428/901; 428/458; 428/195; 428/201; 428/209
[58] Field of Search ............ 430/270, 18, 17, 14, 430/280; 428/901, 458, 195, 201, 209

[56] References Cited

U.S. PATENT DOCUMENTS 4,554,229 11/1985 Small, Jr. .................... 430/920 X Primary Examiner—Cynthia Hamilton

[57] ABSTRACT

A photopolymerizable composition comprising
(a) a monomeric componment which is a half acryloyl ester of bisphenol A epoxy monomer;
(b) an initiating system activated by actinic radiation; and
(c) a preformed macromolecular elastomeric polymer binder.

3 Claims, No Drawings

PHOTOPOLYMERIZABLE COMPOSITION HAVING SUPERIOR ADHESION, ARTICLES AND PROCESSES

This is a division of application Ser. No. 262,267, now U.S. Pat. No. 4,937,172, filed Oct. 20, 1988 which is a continuation of Ser. No. 06/936,880 filed Dec. 2, 1986, now abandoned.

The present invention is directed to photopolymerizable compositions having superior adhesion properties, articles having a photopolymer layer formed from the photopolymerizable composition and processes of forming such articles.

Photosensitive compositions particularly useful as photoresists are well known in the prior art. Conventionally these compositions are stored in roll form. The composition is adhered to a support film to form a two ply material such as disclosed in U.S. Pat. No. 4,293,635 or more conventionally in a three ply material such as U.S. Pat. No. 3,469,982 with the composition sandwiched between a support film and a cover sheet. The material is unwound from a roll and the cover sheet, if present, is removed from contact with the photosensitive composition prior to use in lamination to a substrate, e.g., in manufacture of printed circuit boards. Specific uses of photosensitive compositions such as for solder mask are well known, e.g., U.S. Pat. No. 4,278,752 or for permanent masks in building up conductive layers without necessarily employing solder, e.g., U.S. Pat. No. 4,157,407, U.S. Pat. No. 4,283,243 and U.S. Pat. No. 4,469,777.

U.S. Pat. No. 4,554,229 discloses a specified dielectric layer in a multilayer integrated circuit which comprises by weight 40-65% triazine, 0 to 30% rubber resin, 0 to 50% epoxy-acrylic hybrid resin or individual epoxy and acrylate resins, 0 to 2% hardener, 0 to 8% crosslinking agent, 0 to 5% coupling agent and ½ to 3% photoinitiator. An example of a hybrid resin is a half arylate of diglycidyl ether of bisphenol-A.

Although in each of these prior art publications the adhesion of a photopolymerizable film to a substrate particularly by a lamination process is important, additional criticality is introduced in the present invention in the degree of adhesive force of the photopolymerizable film to another surface. The photopolymerizable compositions of the present invention are particularly suitable in formation of multilayer circuit boards.

SUMMARY OF THE INVENTION

The present invention is directed to a photopolymerizable composition comprising:

(a) a monomeric component comprising a half acryloyl ester of bisphenol-A epoxy monomer;

(b) an initiating system activated by actinic radiation; and (c) a preformed macromolecular elastomeric water-insoluble polymer binder having substantially no acidic groups; with the proviso that after exposure of the photopolymerizable composition to actinic radiation the resulting photopolymerizable compositions has the ability to withstand contact for 24 hours with a liquid at a pH 12 maintained at a temperature of 70° C. and with the further proviso that after lamination of the photopolymerizable composition onto a substrate and upon exposure of actinic radiation and curing at a temperature of 150° C. the resulting photopolymerized composition can withstand a peel force of at least 5.0 pounds per linear inch without removal of the exposed and cured composition from the substrate.

Also the present invention is directed to an article having a photopolymer layer formed from the photopolymerizable composition and to processes of formation.

DETAILED DESCRIPTION OF THE INVENTION

In the present invention are disclosed photopolymerizable compositions which can function as permanent resists. These compositions can be formulated to serve as solder masks, i.e., the photopolymerizable composition after application to a substrate such as by lamination followed by imagewise exposure to actinic radiation to cause photopolymerization can withstand contact with molten solder and remains a permanent part of the final substrate. However the photopolymerizable compositions need not be formulated to function as a solder mask since other uses are suitable such as the ability to function as a dielectric to separate electrical conductive paths on a substrate. The composition in its polymerized form can remain permanently on the substrate and serve the same function as a solder mask in the sense of masking portions of the substrate from contact with a material or a precursor to a material which is an electrically conductor. Illustratively it is well known to form conductive areas by electroless techniques onto a substrate which is not electrically conducting. A permanent resist employing a formulation as disclosed herein can be employed to mask areas of the substrate from undesirable contact with the conductive material or precursor thereto such as a catalyst.

The compositions of the present invention are considered to be characterized by a superior ability to adhere to a substrate. Due to this ability the compositions of the present invention can be employed in uses which are not possible with conventional photoresist and solder mask formulations. Illustratively the photopolymer compositions are useful in the manufacture of multilayer printed circuit boards wherein the photopolymer composition must adhere to two separate layers as a photoimageable dielectric layer, e.g., it must adhere not only to an underlying printed circuit substrate but also to an overlying, subsequently cured B-stage epoxy prepreg layer. Such composition after polymerization must maintain its integrity in addition to adherence.

The photopolymerization composition contains a monomeric component (a) which comprises a half acryloyl ester of bisphenol-A epoxy monomer. Preferably this component is of formula (I)

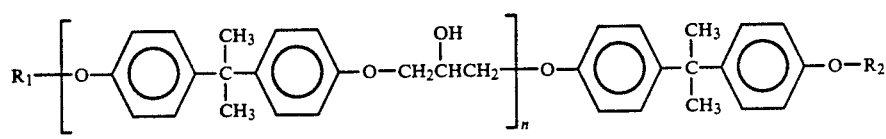

Formula (I)

wherein
R₁ is

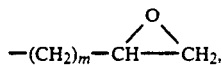

$R_2$ is

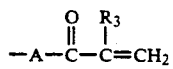

$R_3$ is H or an alkyl group 1 to 10 carbon atoms, and A is

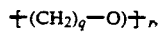

or

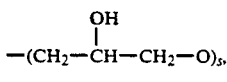

or

—A— represents a linkage between O and

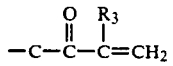

and wherein
m is an integer from 1 to 10,
n is zero or an integer from 1 to 5,
q is an integer from 1 to 10
r is an integer from 1 to 10, and
s is an integer from 1 to 10.

A preferred integer for n is 1 to 3. Also when present in accordance with the above definition a preferred integer for m is 1 to 5 and a preferred $R_3$ alkyl group contains 1 to 5 carbon atoms. Also preferred integer for q, r and z respectively are 1 to 5.

An example of component (a) is of Formula (I) wherein:
$R_1$ is

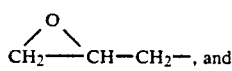

$R_2$ is

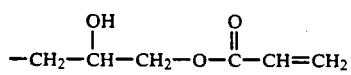

and n is 2.

Formation of Formula I of component (a) ordinarily results in other reaction products. Examples of such products are where $R_1$ and $R_2$ are identical. Illustratively for the preferred half acrylate ester defined above, a diacrylate derivative and diepoxide derivate are present, i.e., $R_1$ and $R_2$ both are

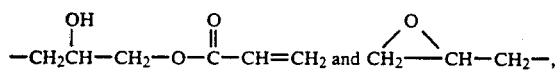

respectively. Also values of n will generally be at least 2 with values of 3, 4 and 5 likewise present. Formula I will generally be at least 30% by weight of the reaction products to form such component (a). In the present disclosure component (a) includes not only the formula I monomer but also other reaction byproducts.

The second component (b) in the photopolymerizable composition is an initiating system activated by actinic radiation. In the present definition an initiating system can be limited to a single constituent. Initiating systems are well known in the prior art such as free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos.: 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos.: 3,427,161; 3,479,185; and 3,549,367 can be used as initiators. Similarly the cyclohexadienone compounds of U.S. Pat. No. 4,341,860 are useful as initiators. Also useful with photoinitiators and photoinhibitors are sensitizers disclosed in U.S. Pat. No. 4,162,162 as well as cationic photoinitiators.

The preformed elastomeric polymer binder has substantially no acidic groups. The presence of such groups interferes with the ability of the photopolymerized composition to withstand contact for a prolonged period of time to a high pH liquid. It is required that the composition of the present invention can withstand contact for 24 hours to a liquid at a pH of 12 maintained at a temperature of 70° C. An example of such liquid is an electroless plating bath liquid composition described on page 7-6 of "Printed Circuits Handbook" Second Edition, Edited by Clyde F. Coombs, Jr., McGraw-Hill Book Company, 1979 (incorporated by reference herein). The property to withstand a heated, high pH liquid is important to prevent swelling and/or resist component removal during electroless plating operations. Examples of elastomeric binders include conventional elastomers, for instance as defined on page 232 of "Hackh's Chemical Dictionary" Fourth Edition, Edited by J. Grant, McGraw-Hill Book Company, 1972, provided the elastomer meets the requirements stated herein water insolubility means the polymer will not dissolve in water at room temperature during 4 hours.

On the basis of the required components in the formulation, component (a) which includes Formula I and also byproducts which lie outside of the formula I definition, (b) initiating system and (c) preformed monomolecular elastomeric binder, component (a) is present in an amount of 10 to 80 parts by weight, component (b) in an amount of 1 to 20 parts by weight and component (c) in an amount of 20 to 80 parts by weight.

In addition to the required components specified above, it has been found that the presence of an acrylated urethane is beneficial since it imparts increased flexibility to the cured layer and reduces brittleness. Conventional acrylated urethanes are suitable and can be present in an amount of 0 to 30 parts by weight.

Particularly preferred types of acrylated urethanes have the structure of formula (II):

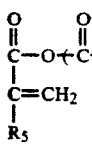 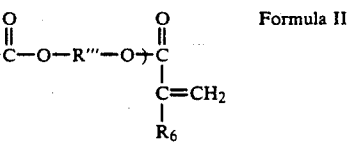      Formula II wherein
R' is an aromatic group;
R'' and R''' are independently polyoxyalkylene containing 1 to 10 carbon atoms;
R'''' is an aromatic group which is different than R';
$R^5$ and $R^6$ are independently alkyl of 1 to 3 carbon atoms or H.

Conventional constituents suitable for incorporation into the composition can include thermal polymerization inhibitors such as: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Various dyes and pigments may be added to increase the visibility of the resist image. Any colorant used, however, should preferably be transparent to the actinic radiation used.

For application to a substrate such as in making a printed circuit board the photosensitive composition is conventionally supported by a film which is well known in the art. A suitable support preferably having a high degree of dimensional stability to temperature changes may be chosen from a wide variety of films composed of high polymers, e.g., polyamides, polyolefins, polyesters, vinyl polymers, and cellulose esters. A preferred support for the present invention is polyethylene terephthalate. Also generally a cover sheet is present in the opposite side of the photosensitive composition present in film form. The protective cover sheet is removed prior to lamination of the photosensitive composition to a substrate. The cover sheet may be chosen from the same group of polymer films listed as supports. Polyethylene and polyethylene terephthalate are particularly useful. The composition on a support is storage stable and is wound in a roll for ease in handling and shipping. Preferably a protective cover sheet is also present.

With the above photopolymerizable compositions superior adhesion can be obtained in accordance with the teachings of the present invention. Additional constituents, including binders and monomers, other than those directly specified can be employed provided that they do not reduce the adhesion of materials below a minimum value necessary for use of the photopolymerizable composition. In the present technology of photopolymerizable compositions many constituents are ordinarily present, e.g., various monomers and various polymeric binders to obtain an optimum balance of properties since not only is initial adhesion important but also adhesion of the photopolymer after exposure to actinic radiation and also the ability of the photopolymer to withstand various metallizing conditions, etc. in formation of a final circuit board. Each constituent can modify the properties of the final article in a positive sense but also may reduce the effect of a desirable property. Illustratively, additives can be introduced to increase storage stability of the supported photopolymerizable layer which is conventionally stored in roll form.

To determine whether an additional constituent can be present or whether such additional constituent can aid the adhesion of the photopolymerizable composition or of the composition containing the photopolymer after exposure to actinic radiation various test procedures can be employed.

One procedure involves applying the composition to a substrate followed by exposure to actinic radiation to prepare the test samples. This test determines the ability of the exposed composition to remain firmly adhered to a substrate, such as copper, without cracking or lifting when such exposed resist is subjected to an external stress. Such procedure can be in accordance with ASTM D 3359-78 Standard Method B wherein a perpendicular lattice pattern is cut in the resist. Pressure sensitive tape is applied to the surface of the resist followed by removal of the tape which can cause damage or removal of the resist.

A further test is an instant adhesion test. A layer of photosensitive composition that is on a support film is applied to a substrate, such as a copper clad fiberglass epoxy panel, and immediately or a short time thereafter the support film is removed from the photosensitive composition. Thereafter pressure sensitive tape is applied to the surface of the composition. After about one and one half minutes the tape is peeled at a constant angle from the surface of the composition which can cause its removal with the tape.

Perhaps the most significant test for particular uses in accordance with the teachings of the present invention is a peel force test particularly measured by an Instron ® peel tester. The reason that this test is considered significant is due to one particularly valuable use of the photopolymerizable composition namely formation of multilayer circuit boards with the ability of the photopolymer composition (i.e., after exposure to actinic radiation) to adhere to another material. In the present specification "photopolymer" refers to polymerization of the photopolymerizable composition. A preferred material for use in this test is a layer containing a B-stage epoxy resin. Such layers are conventionally used in the formation of multilayer printed circuit boards. A deficiency with prior art photopolymer compositions has been their inability to adhere to the surface formed from a B-stage epoxy material and maintain its integrity. Illustratively a series of layers including a photopolymer composition and a B-stage epoxy resin are contacted in a press at elevated temperature to form a multilayer article suitable for further processing steps in manufacture of a multilayer circuit board.

A suitable test procedure for measuring adhesion of the photopolymer composition to the B-stage epoxy resin or to another surface is through peel force measurement such as with an Instron ® test device. One procedure employed is set forth in Part II of the Examples and is referred to herein as the multilayer Instron ® test procedure.

In such measurements preferably a value of at least 5 pounds per linear inch is obtained and more preferably a value of at least 6 pounds per linear inch is realized. Even more preferably at least 7 pounds per linear inch gives the ability of the final article to withstand rigorous stresses on the multilayer printed circuit board. The photopolymerizable compositions are storable stable and can be stored for two weeks, preferably four weeks, at 40° C. without substantial crosslinking.

In the following examples percentages and parts are by weight and degrees in centigrade unless otherwise indicated.

EXAMPLES 1 to 14

Part I—Permanent Dielectric Photopolymer Resist

In each of the examples a coating solution was prepared to function as a permanent dielectric photopolymer resist composition. The composition was prepared at 25% (by weight) solids in methylene chloride solvent. The solution was coated on a 0.001 inch Mylar ® polyethylene terephthalate support using a 0.01 inch coating knife to give a 0.0015 inch thick film composition. The film of the photopolymerizable composition was laminated to both sides of an unclad 0.007 inch glass epoxy substrate which was coated with palladium chloride catalyst suitable for electroless copper plating. The film of the photopolymerizable composition on each side of the substrate was exposed to 200M joules/cm² UV radiation through a negative photomask resulting in a circuit pattern. After exposure, the substrate was allowed to stand for thirty minutes, the Mylar ® polyester support was peeled off both sides of the substrate, followed by exposing the coated substrate to spray development at 67° F. for sixty seconds using 1,1,1 trichloroethane which removed unexposed portions of the photopolymerizable composition.

The substrate with the developed photopolymer film pattern on each side of the substrate was cured at 150° C. in an oven followed by exposure to 5 joules/cm² UV radiation on each side of the substrate. The substrate was placed in a CC-4 Kollmorgan electroless copper plating bath for eighteen hours to deposit approximately one mil of electroless copper to form an additive plated circuity pattern on both sides of the substrate. In each case the photopolymer layer survived the electroless copper conditions (pH approximately 12, temperature approximately 70° C.) without damage.

This test procedure demonstrated that each photopolymer composition has the ability to function as a permanent additive photopolymer resist.

Part II—Peel Force Testing

A film of the supported photopolymerizable composition described in Part I was applied to both sides of 0.007 inch thick FR-4 glass-epoxy substrate and exposed to 300 mj/cm² UV radiation.

After removal of the support film two sheets each of 0.004 inch thick B-stage glass epoxy prepreg (Nelco, New England Lamination Company) with a total thickness of 0.008 inch were laminated to each side of the exposed photopolymer composition. The outer layer of the two layer prepreg, i.e., on the side furthest from the 0.007 inch thick FR-4 glass-epoxy substrate was covered with epoxy laminate which in turn had one ounce of copper per square foot (0.0014 inch thickness) laminated to the outer side.

The multilayer test specimen was laminated into a single article in a Multilayer Lamination Press (Wabash Press Model 100-1818-4 TMACX, Wabash Metal Products, Inc.) with a Tedlar ® polyvinyl fluoride leader present between a B-stage epoxy prepreg and the photopolymer layer. Lamination conditions were one hour at 170° C. (340° F.) and 18 tons pressure (250 PSI).

Samples of one inch width and twelve inch length were cut from the laminated article and placed around a wheel (6 inch diameter) with the adhesion measured as a peel force between the photopolymer layer closest to the wheel and the B stage epoxy layer in contact thereto was determined using a model 1122 Instron ® peel tester at a peel rate of two inches per minute (crosshead speed with more than fifty percent of the length of the sample peeled). The Tedlar ® leader facilitated connection to the test device.

Part III

The following list identifies the components employed in the examples.

Monomers

Compound A

![Formula (I)]

$$R_1 \!-\!\!\left[\!O\!-\!\!\bigcirc\!\!-\!\!\underset{CH_3}{\overset{CH_3}{C}}\!\!-\!\!\bigcirc\!\!-\!O\!-\!CH_2\overset{OH}{\underset{}{C}}HCH_2\!\right]_n\!\!-\!O\!-\!\!\bigcirc\!\!-\!\!\underset{CH_3}{\overset{CH_3}{C}}\!\!-\!\!\bigcirc\!\!-\!O\!-\!R_2$$

Based on gel permeation chromatography (GPC), the percentages of the various derivatives are as follows:

| Derivative | % |
|---|---|
| Half-acrylate | ~42 |
| $R_1 = -CH_2CH\overset{O}{\overset{\diagup\diagdown}{\phantom{x}}}CH_2,$ | |
| $R_2 = -CH_2\overset{OH}{\underset{}{C}}HCH_2O\overset{O}{\overset{\|}{C}}-CH\!=\!CH_2$ | |
| Diacrylate | ~26 |

-continued

| Derivative | % |
|---|---|
| $R_1 = R_2 = -CH_2\overset{\underset{\mid}{OH}}{C}HCH_2-O-\overset{\underset{\|}{O}}{C}-CH=CH_2$ | |
| Diepoxide | ~18 |
| $R_1 = R_2 = -CH_2\overset{\overset{O}{\diagup\|}}{C}HCH_2$ | |

The remaining ~14% is higher molecular weight analogues, i.e., partial acrylates diacrylates, and diepoxides of n=3, 4, 5, etc. oligomers.

| | |
|---|---|
| Celrad ® 3700 | di-(3-acryloxy-2-hydroxypropyl)-ether of bisphenol-A |
| TMPTA | trimethylol propane triacrylate |
| CMD-6700 | acrylated urethane |
| RDX-51027 | di-(3-acryloxy-2-hydroxypropyl)-ether of tetrabromo bisphenol-A |
| Chempol ®-19-4827 | acrylated aromatic urethane |
| Gafguard-238 | acrylated aliphatic urethane |
| TDMA | triethylene glycol dimethacrylate |

Binders

| | |
|---|---|
| Elvacite ® 2051 | Polymethylmethacrylate (MW 150,000) |
| Acryloid ® BTA-IIIs | Methylmethacrylate/butadiene/-styrene terpolymer purchased from Rohm & Haas. |
| Acryloid ® BTA-IIIN2 | Same as above with higher butadiene content |

Initiators and Adjuvants

| | |
|---|---|
| Benzophenone | |
| Michler's ketone | |
| o-Cl HABI | (2,2'-bis(2-chlorophenyl)-4,4',5,5'-tetraphenyl biimidazole) |
| TLA-454 | (tris(4-diethylamino-O-tolyl)-methane) |
| Ethyl Michler's ketone | |
| TMCH | 4-methyl-4-trichloromethyl-2,5-cyclohexadienone) |
| Epon 834 | diglycidyl ether of bisphenol-A |

Note

In the following examples crystal violet, polycaprolactone and yellow pigment (chromatol Yellow 3G) or blue pigment (Monastrol Blue BT 284D) milled into Elvacite 2051 resin were employed in similar amounts which was not considered to significantly affect the peel force measurements. The use of these components was as follows:

TABLE 1

| Ex. No. | 1 | 2 | 3 | 4 | 5 | 6 | 7 | 8 | 9 | 10 | 11 | 12 |
|---|---|---|---|---|---|---|---|---|---|---|---|---|
| Crystal violet | 0.015 | 0.015 | 0.015 | — | 0.015 | 0.015 | 0.015 | 0.2 | 0.2 | 0.015 | 0.015 | 0.015 |
| Leuco Crystal violet | | | | | | — | — | 0.2 | 0.2 | — | | |
| Polycaprolactone | 1.2 | 1.2 | 1.2 | 1.0 | 1.2 | — | — | — | — | — | — | — |
| Yellow pigment | 0.3 | 0.3 | 0.3 | 0.7 | 0.7 | 0.7 | 0.7 | 0.7 | 0.7 | 0.7 | 0.7 | 0.7 |
| Cyan pigment | 0.3 | 0.3 | 0.3 | 0.3 | 0.3 | 0.3 | 0.3 | 0.3 | 0.3 | 0.3 | 0.3 | 0.3 |

| Ex. No. | 13 | 14 | 15 | 16 | 17 | 18 | 19 | 20 | 21 | 22 |
|---|---|---|---|---|---|---|---|---|---|---|
| Crystal violet | 0.015 | 0.015 | 0.015 | 0.015 | 0.015 | 0.015 | 0.015 | 0.015 | 0.015 | 0.015 |
| Leuco Crystal violet | | | | | | | | | | |
| Polycaprolactone | — | — | | | | | | | | |
| Yellow Pigment | 0.7 | 0.7 | 0.7 | 0.7 | 0.7 | 0.7 | 0.7 | 0.7 | 0.7 | 0.7 |
| Cyan pigment | 0.3 | 0.3 | 0.3 | 0.3 | 0.3 | 0.3 | 0.3 | 0.3 | 0.3 | 0.3 |

The remaining constituents of the examples are as follows with the peel force measurements in accordance with Part II of these examples stated on the last line.

TABLE 2

| Ex. No. | 1 | 2 | 3 | 4 | 5 | 6 | 7 | 8 | 9 | 10 | 11 |
|---|---|---|---|---|---|---|---|---|---|---|---|
| Parts of Ingredients | | | | | | | | | | | |
| Celrad 3700 | 24 | — | — | 14 | 19 | — | — | — | — | 7 | — |
| TMPTA | 24 | 24 | — | — | — | — | 7.1 | 7 | 7 | 27 | — |
| Composition A | — | 24 | 24 | 22 | 15 | 12 | 27 | 27 | 27 | 27 | 27 |
| CMD-6700 | — | — | 24 | 16 | 18 | 24 | 16 | — | — | 16 | 16 |
| RDX-50127 | — | — | — | — | — | 13 | — | — | — | — | — |
| Epon 834 | | | | | | | | | | | |
| Chempol-19-4827 | — | — | — | — | — | — | — | 16 | — | — | — |
| Gafguard 238 | — | — | — | — | — | — | — | — | 16 | — | — |
| TDMA | — | — | — | — | — | — | — | — | — | — | 7 |
| Elvacite ® 2051 | 19 | 19 | 19 | 16 | 16 | 16 | 19 | 19 | 19 | 19 | 19 |
| Acryloid ® BTA-IIIs | 26.2 | 26.2 | 26.3 | 26.2 | 26.2 | 26.2 | — | 26.2 | 26.2 | 26.2 | 26.2 |
| Acryloid ®-BTA-IIIN2 | — | — | — | — | — | — | 26.2 | — | — | — | — |
| Benzophenone | 5 | 4 | 4 | — | — | — | 4 | 4 | 4 | 4 | 4 |
| Michler's ketone | 0.15 | 0.15 | 0.15 | 0.15 | 0.15 | 0.15 | — | — | — | — | — |
| o-Cl HABI | 4 | 4 | 4 | 4 | 4 | 4 | 4 | 4 | 4 | 4 | 4 |
| TLA-454 | 0.5 | 0.5 | 0.5 | 0.5 | 0.5 | 0.5 | 0.5 | 0.5 | 0.5 | 0.5 | 0.5 |
| Ethyl Michler's ketone | — | — | — | — | — | 0.16 | 0.16 | 0.16 | 0.16 | 0.16 | 0.16 |
| TMCH | — | — | — | — | — | — | 0.14 | 0.14 | 0.14 | 0.14 | 0.1 |

TABLE 2-continued

| Ex. No. | 12 | 13 | 14 | 15 | 16 | 17 | 18 | 19 | 20 | 21 | 22 |
|---|---|---|---|---|---|---|---|---|---|---|---|
| Peel force lbs/inch | 1.5 | 1.0 | 8.0 | 3.0 | 2.0 | 6.0-10.0 | 7.0 | 6.0-7.0 | 4-6.0 | 8-9.0 | 8-10 |
| Parts of Ingredients | | | | | | | | | | | |
| Celrad 3700 | — | — | — | — | — | — | — | 24 | 12 | 36 | — |
| TMPTA | — | 7 | 7 | — | — | 20 | 10 | — | — | — | — |
| Composition A | 18 | 27 | 33 | — | 48 | 30 | 40 | — | — | — | 74 |
| CMD-6700 | 16 | 16 | 16 | 48 | — | — | — | — | — | — | — |
| RDX-50127 | — | — | — | — | — | — | — | — | — | — | — |
| Epon 834 | | | | | | | | 24 | 36 | 12 | — |
| Chempol-19-4827 | — | — | — | — | — | — | — | — | — | — | — |
| Gafguard 238 | — | — | — | — | — | — | — | — | — | — | — |
| TDMA | 16 | — | — | — | — | — | — | — | — | — | — |
| Elvacite ® 2051 | 19 | 19 | 19 | 19 | 19 | 19 | 19 | 19 | 19 | 19 | 19 |
| Acryloid ® BTA-IIIs | 26.2 | 26.2 | 26.2 | 26.2 | 26.2 | 26.2 | 26.2 | 26.2 | 26.2 | 26.2 | — |
| Acryloid ®-BTA-IIIN2 | — | — | — | — | — | — | — | — | — | — | — |
| Benzophenone | 4 | — | — | 4.0 | 4.0 | 4.0 | 4.0 | 4.0 | 4.0 | 4.0 | 4.0 |
| Michler's ketone | — | — | — | — | — | — | — | — | — | — | — |
| o-Cl HABI | 4 | 4 | 4 | 4.0 | 4.0 | 4.0 | 4.0 | 4.0 | 4.0 | 4.0 | 4.0 |
| TLA-454 | 0.5 | 0.5 | 0.5 | 0.5 | 0.5 | 0.5 | 0.5 | 0.5 | 0.5 | 0.5 | 0.5 |
| Ethyl Michler's ketone | 0.16 | — | — | 0.16 | 0.16 | 0.16 | 0.16 | 0.16 | 0.16 | 0.16 | 0.16 |
| TMCH | 0.1 | — | — | 0.14 | 0.14 | 0.14 | 0.14 | 0.14 | 0.14 | 0.14 | 0.14 |
| Peel force lbs/inch | 7-9 | 6-8.0 | 8-9.0 | 2.0 | 7.0 | 3.0 | 7.0 | 3.0-4.0 | 3.0 | 2.0 | 0.5 |

The photopolymerizable compositions of this invention are exemplified by Examples 3, 6 through 14, 16 and 18 and of these, the composition of Example 13 is preferred because of overall performance. Examples 1, 15, 19, 20, and 21 demonstrate the decrease in peel force, and therefore the adhesion, when component "a" of the invention is excluded from the formulation. In Example 1, component "a" is replaced by the triacrylates TMPTA and the diacrylated bisphenol-A leading to loss of adhesion. In Examples 2, 4 and 5, component "a" is present along with substantial amounts of the same two diacrylates leading again to adhesion failure as compared to Example 3 where only Compound A and the acrylated urethane CMD-6700 are present. When the acrylated urethane is used alone in the absence of Compound A, as in Example 15, adhesion again drops dramatically. In Examples 19, 20 and 21, combinations of diglycidyl and diacrylated bisphenol-A and acrylated urethane in the absence of Compound "A" likewise produce reduced peel force.

Examples 10, 17 and 18 demonstrate the adhesion change effected by variation of the diacrylate composition relative to that of Compound A. Although adhesion is improved in Example 18 by increasing the proportion of Compound A it likewise is improved when the particular combination of the diacrylates are increased beyond previous limits as in Example 10.

Example 22 demonstrates the effect on adhesion of Component C. When the elastomeric binder is excluded from the formulation, peel force and thereby adhesion is dramatically reduced.

Examples 6 through 9, 11 through 14 and 16 demonstrate variations in component compositions for formulations which fall within the invention.

What is claimed is:

1. A Multilayer printed circuit board comprising two conductive layers separated by a dielectric layer of a photopolymerized composition formed from a precursor photopolymerizable composition which comprises
   (a) a monomeric component which is a half acryloyl ester of bisphenol A epoxy monomer;
   (b) an initiating system activated by actinic radiation; and
   (c) a preformed macromolecular elastomeric water-insoluble polymer binder having substantially no acidic groups; with the proviso that after exposure of the photopolymerizable composition to actinic radiation a resulting photopolymerized composition has the ability to withstand contact without dissolution for 24 hours with a liquid at a pH 12 maintained at a temperature of 70° C. and with the further proviso that after lamination of the photopolymerizable composition onto a glass-epoxy substrate and upon exposure of actinic radiation and curing at a temperature of 150° C. the resulting photopolymerized composition can withstand a peel force of at least 5.0 pounds per linear inch without removal of the exposed and cured photopolymerized composition from the substrate.

2. The multilayer printed circuit board of claim 1 wherein component (a) comprises

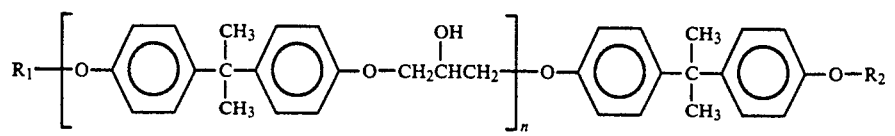

Formula (I)

wherein
R$_1$ is

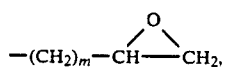

R$_2$ is

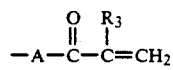
$R_3$ is H or an alkyl group 1 to 10 carbon atoms, and
A is
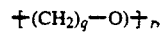
or
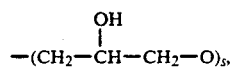
or
—A— represents a linkage between O and
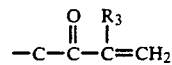
and wherein
m is an integer from 1 to 10,
n is zero or an integer from 1 to 5,
q is an integer from 1 to 10
r is an integer from 1 to 10, and
s is an integer from 1 to 10.
3. The multilayer printed circuit board of claim 2 wherein Formula (I) of component (a) includes
$R_1$ is
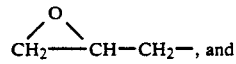
$R_2$ is
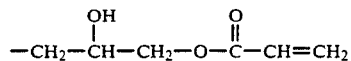
and n is 2.
* * * * *